(12) United States Patent
Watanabe

(10) Patent No.: US 9,455,258 B2
(45) Date of Patent: Sep. 27, 2016

(54) SEMICONDUCTOR DEVICE AND METHOD OF DESIGNING THE SAME

(71) Applicant: FUJITSU SEMICONDUCTOR LIMITED, Yokohama-shi, Kanagawa (JP)

(72) Inventor: Kenji Watanabe, Kuwana (JP)

(73) Assignee: FUJITSU SEMICONDUCTOR LIMITED, Yokohama (JP)

(*) Notice: Subject to any disclaimer, the term of this patent is extended or adjusted under 35 U.S.C. 154(b) by 30 days.

(21) Appl. No.: 14/335,389

(22) Filed: Jul. 18, 2014

(65) Prior Publication Data

US 2015/0028451 A1 Jan. 29, 2015

(30) Foreign Application Priority Data

Jul. 24, 2013 (JP) ................. 2013-153383

(51) Int. Cl.
| | |
|---|---|
| *H01L 27/108* | (2006.01) |
| *H01L 27/02* | (2006.01) |
| *H01L 27/115* | (2006.01) |
| *G06F 17/50* | (2006.01) |
| *H01L 49/02* | (2006.01) |
| *G11C 11/22* | (2006.01) |
| *H01L 27/08* | (2006.01) |

(52) U.S. Cl.
CPC ..... *H01L 27/10808* (2013.01); *G06F 17/5068* (2013.01); *H01L 27/0207* (2013.01); *H01L 27/11509* (2013.01); *H01L 28/40* (2013.01); *G11C 11/22* (2013.01); *H01L 27/0805* (2013.01)

(58) Field of Classification Search
CPC ................................. H01L 27/10808
See application file for complete search history.

(56) References Cited

U.S. PATENT DOCUMENTS

| | | |
|---|---|---|
| 6,956,289 B2 | 10/2005 | Kunikiyo |
| 7,102,223 B1 | 9/2006 | Kanaoka et al. |
| 2003/0015743 A1 | 1/2003 | Ogawa et al. |
| 2003/0185068 A1 | 10/2003 | Saito et al. |
| 2004/0222528 A1 | 11/2004 | Kunikiyo |
| 2006/0289998 A1 | 12/2006 | Kanaoka et al. |

(Continued)

FOREIGN PATENT DOCUMENTS

| | | |
|---|---|---|
| EP | 1258923 A2 | 11/2002 |
| JP | 2001-196372 A | 7/2001 |

(Continued)

OTHER PUBLICATIONS

Partial European Search Report dated Dec. 16, 2014, issued in corresponding European Patent Application No. 14177616.1 (6 pages).

(Continued)

*Primary Examiner* — Fernando L Toledo
*Assistant Examiner* — Valerie N Newton
(74) *Attorney, Agent, or Firm* — Westerman, Hattori, Daniels & Adrian, LLP

(57) ABSTRACT

A semiconductor device includes: a semiconductor substrate having a memory cell array region and a peripheral circuit region; a ferroelectric capacitor formed over the semiconductor substrate in the memory cell array region; and a dummy capacitor formed over the semiconductor substrate in the peripheral circuit region, with a layered structure same as that of the ferroelectric capacitor, with an area larger than that of the ferroelectric capacitor, and with a line width not larger than the width of the ferroelectric capacitor.

9 Claims, 20 Drawing Sheets

(56) References Cited

U.S. PATENT DOCUMENTS

2008/0087928 A1 4/2008 Nagai
2008/0122085 A1 5/2008 Kanaoka et al.
2009/0321803 A1 12/2009 Kim et al.
2010/0252924 A1 10/2010 Kanaoka et al.
2012/0205788 A1 8/2012 Kanaoka et al.

FOREIGN PATENT DOCUMENTS

| JP | 2003-100910 A | 4/2003 |
| JP | 2004-095577 A | 3/2004 |

OTHER PUBLICATIONS

Extended European Search Report dated Apr. 10, 2015, issued in corresponding Patent Application No. 14177616.1 (10 pages).

SEMICONDUCTOR DEVICE AND METHOD OF DESIGNING THE SAME

CROSS-REFERENCE TO RELATED APPLICATION

This application is based upon and claims the benefit of priority of the prior Japanese Patent Application No. 2013-153383, filed on Jul. 24, 2013, the entire contents of which are incorporated herein by reference.

FIELD

The embodiments discussed herein are directed to a semiconductor device, and a method of designing the same.

BACKGROUND

In some cases of semiconductor devices having ferroelectric random accessory elements, from the viewpoint of improving in-plane uniformity of etching for forming a layered structure of ferroelectric capacitors, dummy capacitors are arranged in the peripheral circuit region so as to increase an apparent occupancy of the ferroelectric capacitors in a chip.

Patent Document 1: Japanese Laid-open Patent Publication No. 2001-196372

Patent Document 2: Japanese Laid-open Patent Publication No. 2003-100910

Patent Document 3: Japanese Laid-open Patent Publication No. 2004-095577

However, the dummy capacitors provided in the peripheral circuit region have sometimes caused pattern defect, to thereby degrade yield and reliability of the semiconductor devices.

SUMMARY

According to one aspect of embodiment, there is provided a semiconductor device which includes: a semiconductor substrate that includes a memory cell array region and a peripheral circuit region; a ferroelectric capacitor formed over the semiconductor substrate in the memory cell array region, with a first area and a first width; and a dummy capacitor formed over the semiconductor substrate in the peripheral circuit region, with a layered structure same as a layer structure of the ferroelectric capacitor, with a second area larger than the first area, and with a second width not larger than the first width.

According to other aspect of embodiment, there is provided a method of designing a semiconductor device that includes a ferroelectric capacitor formed in a memory cell array region, and a dummy capacitor formed in a peripheral circuit region, with a layered structure same as a layered structure of the ferroelectric capacitor, the method comprising: patterning the dummy capacitor, that has a line width equal to a width of the ferroelectric capacitor, and that has an area larger than an area of the ferroelectric capacitor.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

First Embodiment

A semiconductor device and a method of manufacturing the same according to a first embodiment will be explained referring to FIG. 1 to FIG. 16.

Figure 1:
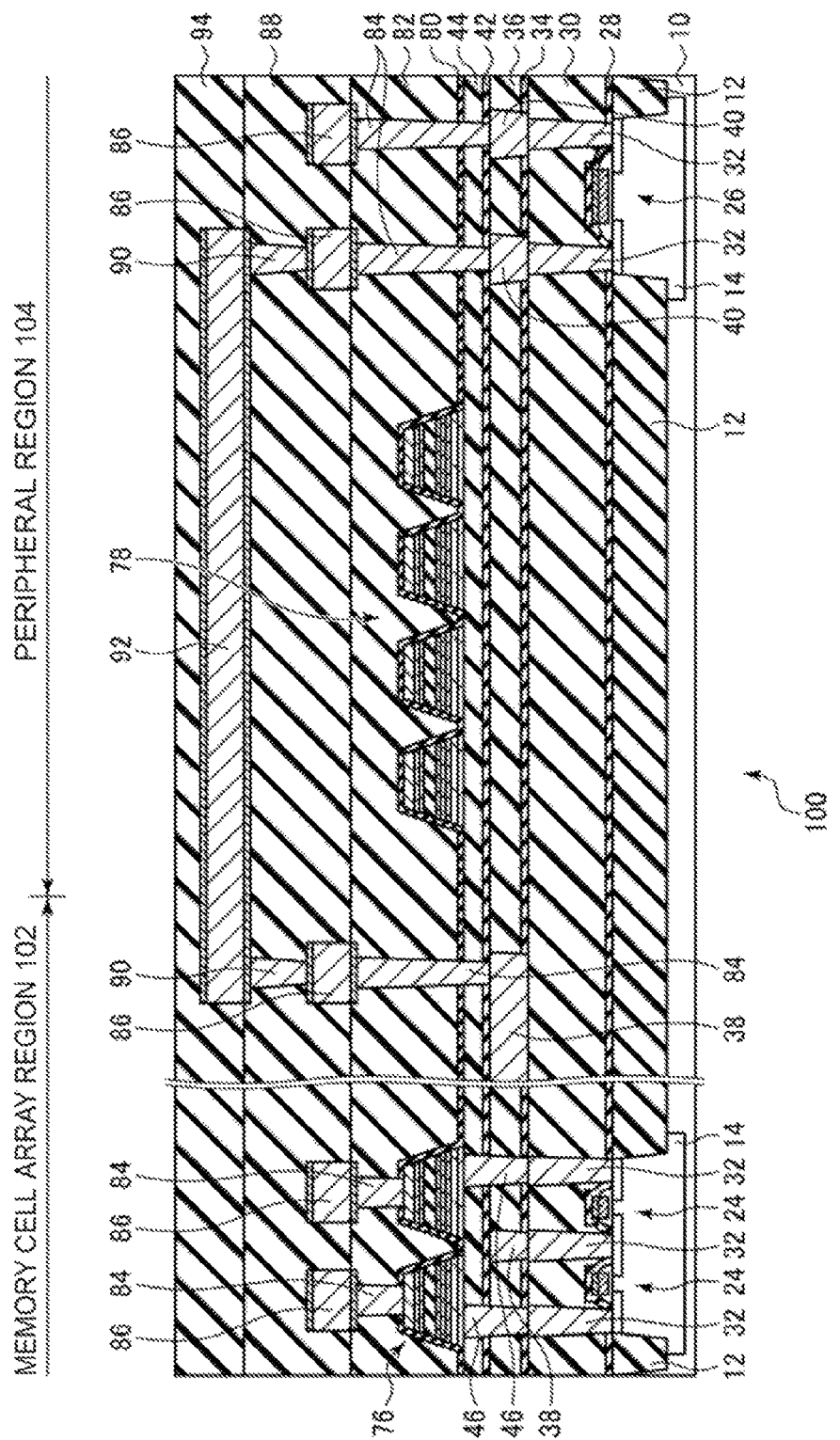
FIG. 1 and FIG. 2 are schematic cross sectional views (part 1 and part 2) illustrating a configuration of a semiconductor device of a first embodiment
Figure 2:
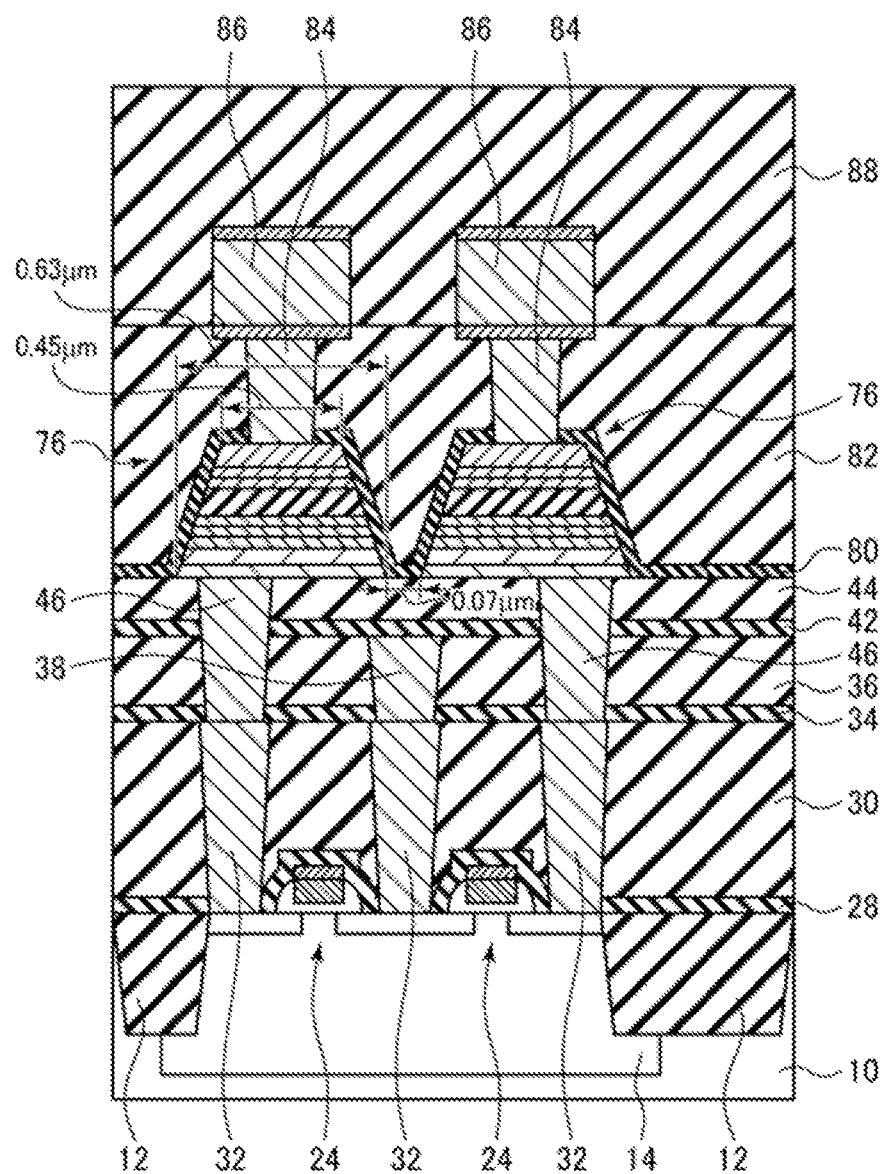
Figure 3:
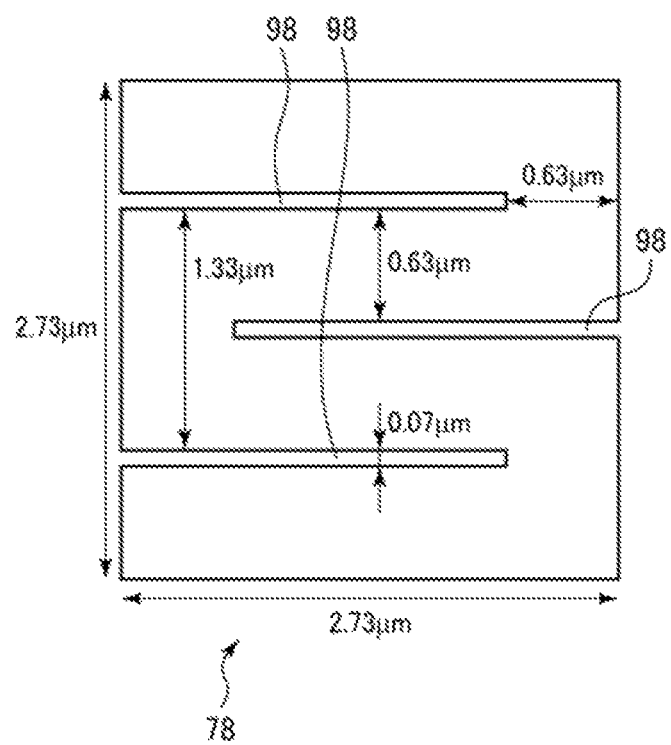
FIG. 3 to FIG. 5 are plan views (part 1, part 2, and part 3) illustrating a configuration of the semiconductor device of the first embodiment.
Figure 4:
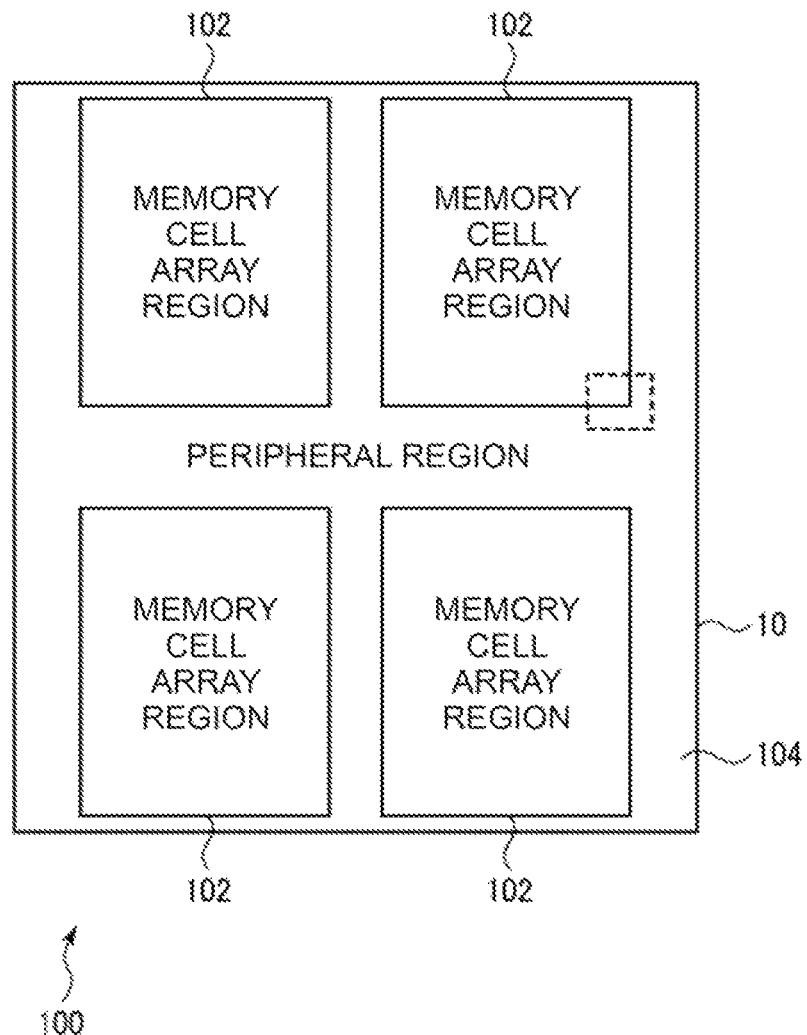
Figure 5:
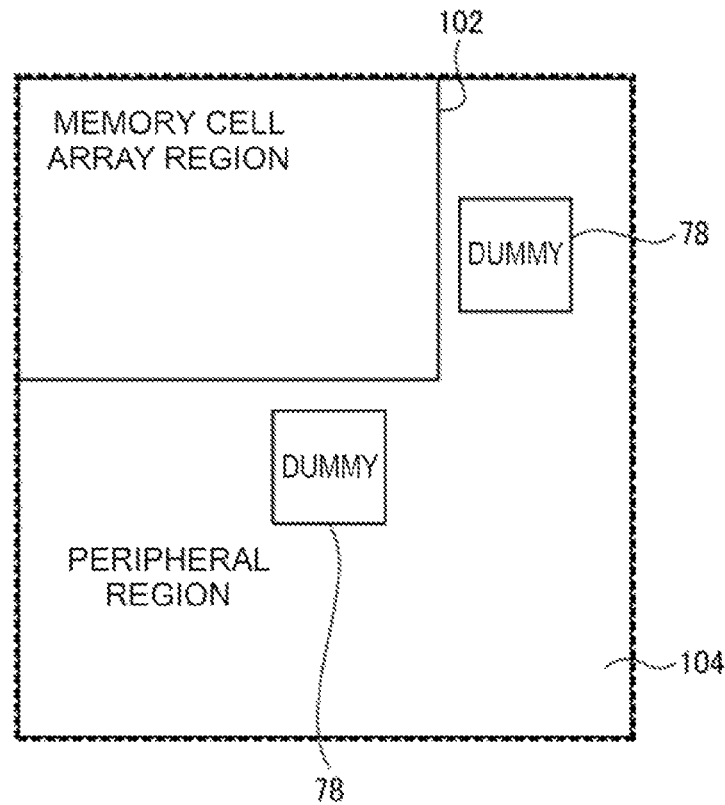
Figure 6:
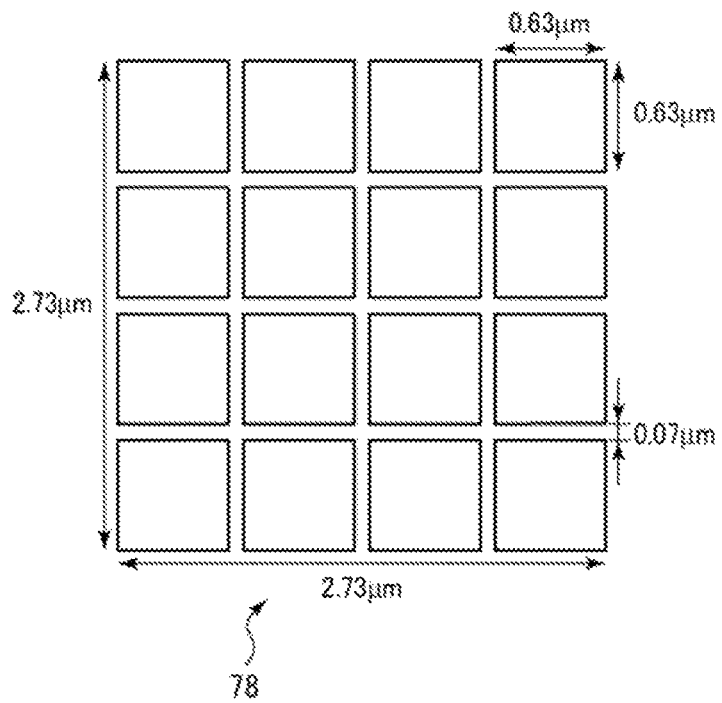
FIG. 6 is a plan view illustrating a typical pattern of a dummy capacitor.
Figure 7A:
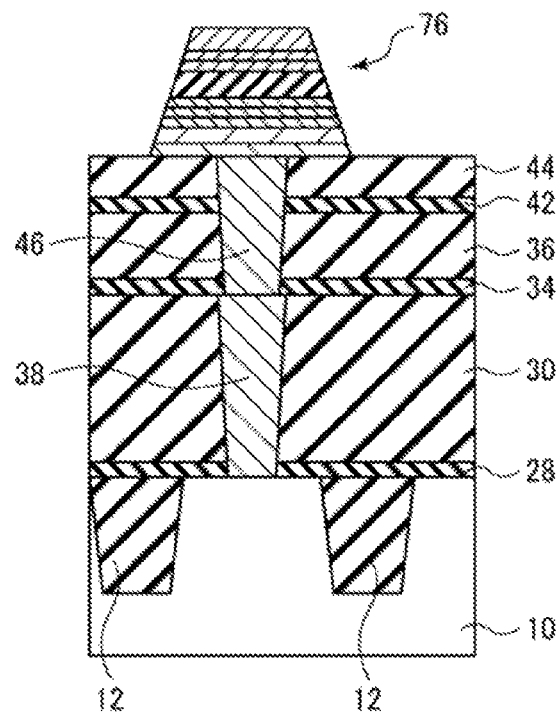
FIGS. 7A and 7B are drawings explaining a difference between configurations of a ferroelectric capacitor and the dummy capacitor.
Figure 7B:
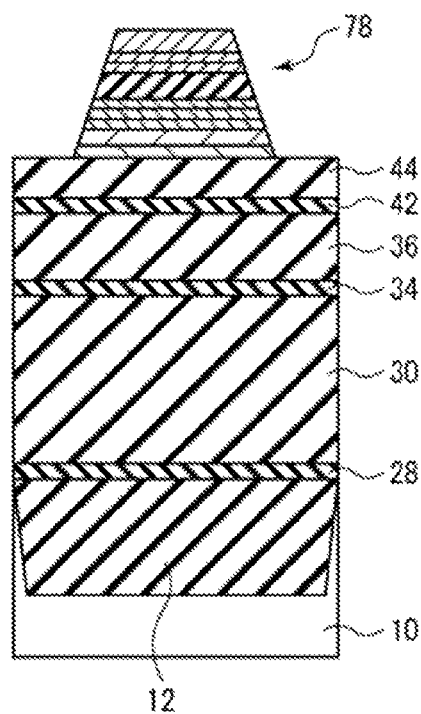
Figure 8:
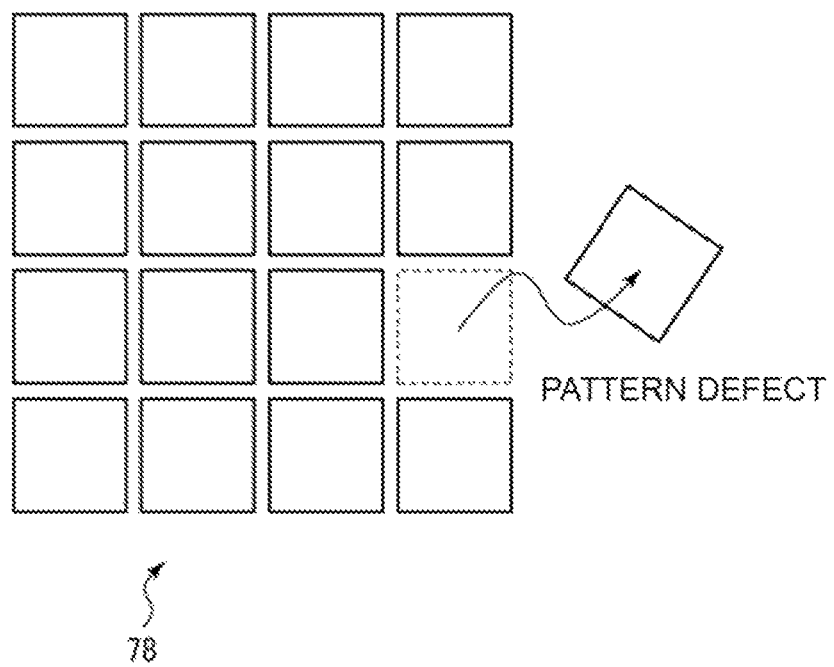
FIG. 8 is a drawing explaining a pattern defect of the dummy capacitor.
Figure 9A:
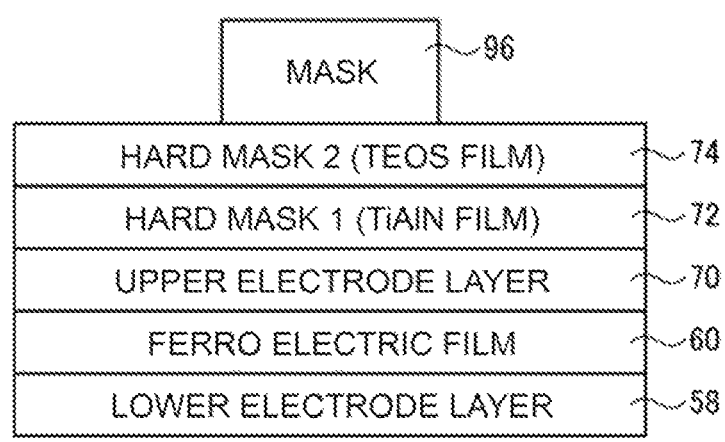
FIGS. 9A and 9B are drawings explaining a method of patterning a layered structure of the ferroelectric capacitor and a related problem.
Figure 9B:
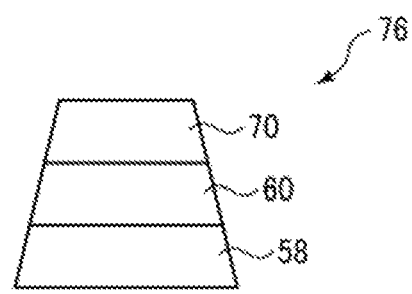
Figure 10A:
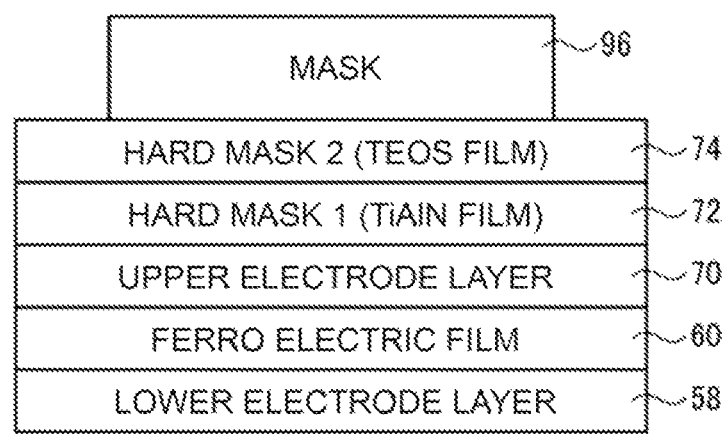
FIGS. 10A and 10B are drawings explaining a method of patterning a layered structure of the dummy capacitor and a related problem.
Figure 10B:
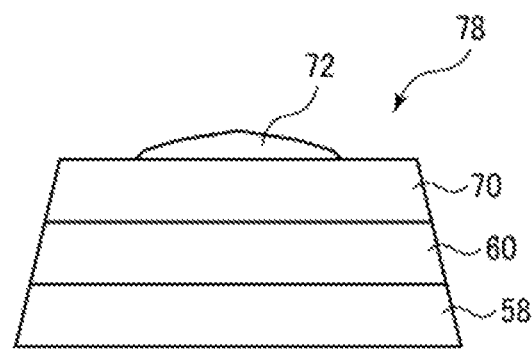

FIG. 1 and FIG. 2 are schematic cross sectional views explaining a configuration of a semiconductor device according to this embodiment. FIG. 3 to FIG. 5 are plan views illustrating a configuration of the semiconductor device according to this embodiment. FIG. 6 is a plan view illustrating a typical pattern of a dummy capacitor. FIGS. 7A and 7B are drawings explaining a difference between configurations of a ferroelectric capacitor and the dummy capacitor. FIG. 8 is a drawing explaining a pattern defect of the dummy capacitor. FIGS. 9A and 9B are drawings illustrating a method of patterning a layered structure of the ferroelectric capacitor, and a related problem. FIGS. 10A and 10B are drawings illustrating a method of patterning a layered structure of the dummy capacitor, and a related problem. FIG. 11 to FIG. 16 are cross sectional process diagrams illustrating a method of manufacturing a semiconductor device according to this embodiment.

First, the configuration of the semiconductor device according to this embodiment will be explained referring to FIG. 1 to FIG. 3.

As illustrated in FIG. 1, a silicon substrate 10 has a memory cell array region 102, and a peripheral circuit region 104 provided around the memory cell array region 102. In the surficial portion of the silicon substrate 10, an element isolation insulating film 12 which demarcates active regions is provided. In the active region demarcated in the memory cell array region 102, MIS transistors 24 are formed as selection transistors. In the active region demarcated in the peripheral circuit region 104, a MIS transistor 26 is formed as transistors for a peripheral circuit.

Over the silicon substrate 10 having the MIS transistors 24, 26 formed thereon, an insulating interlayer 30 is formed. In the insulating interlayer 30, contact plugs 32 which are connected to the MIS transistors 24, 26 are buried.

Over the insulating interlayer 30 having the contact plugs 32 buried therein, an insulating interlayer 36 is formed. In the insulating interlayer 36, an interconnect layer 38 (bit line) which is electrically connected through the contact plugs 32 to the MIS transistors 24, and an interconnect layer 40 which is connected through the contact plugs 32 to the MIS transistor 26, are buried.

Over the insulating interlayer 36 having the interconnect layers 38, 40 buried therein, an insulating interlayer 44 is formed. In the insulating interlayers 44, 30, contact plugs 43 which are connected to the contact plugs 32 are buried.

Over the insulating interlayer 44 having the contact plugs 46 formed therein, ferroelectric capacitors 76 and dummy capacitors 78 are formed. The ferroelectric capacitors 76 are provided in the memory cell array region 102. Lower electrodes of the ferroelectric capacitors 76 are electrically connected through the contact plugs 46, 32 to the MIS transistors 24. The dummy capacitors 78 are provided in the peripheral circuit region 104. The dummy capacitors 78 are structural bodies having a layered structure same as that of the ferroelectric capacitors 76, but not electrically connected to any other elements.

The dummy capacitors 73 are arranged in the peripheral circuit region, in order to improve in-plane uniformity of etching for forming a layered structure of the ferroelectric capacitors, so as to increase an apparent occupancy of the ferroelectric capacitors in a chip. From this point of view, the dummy capacitors 78 are mainly formed in a region other than a region for forming contact plugs used for connection between interconnects and the silicon substrate 10, or in a region other than a specific arrangement prohibited region.

Over the insulating inter layer 44 having the ferroelectric capacitors 76 and the dummy capacitors 78 formed therein, a protective insulating film 80, composed of alumina or the like, for protecting the ferroelectric capacitors 76, and an insulating interlayer 82 are formed. In the insulating interlayers 82, 44, the ferroelectric capacitors 76, and contact plugs 84 which are connected to the interconnect layers 38, 40 and so forth are buried.

Over the insulating interlayer 82 having the contact plugs 84 buried therein, an interconnect layer 86 is formed so as to be connected to the contact plugs 84. Over the insulating interlayer 82 having the interconnect layer 86 formed thereon, an insulating interlayer 83 is formed. In the insulating interlayer 88, contact plugs 100 which are connected to the interconnect layer 86 are buried.

Over the insulating interlayer 88 having the contact plugs 90 buried therein, an interconnect layer 92 is formed so as to be connected to the contact plugs 90. Over the insulating interlayer 88 having the interconnect layer 92 formed thereon, an insulating interlayer 94 is formed.

Now in the semiconductor device 100 of this embodiment, the area of the dummy capacitor 78 is larger than the area of the ferroelectric capacitor 76, and the line width of the dummy capacitor 78 is not larger than true width of the ferroelectric capacitor 76.

Assuming now that, as an exemplary case, the ferroelectric capacitor 76 formed in the memory cell array region has a square bottom face, 0.63 μm each side, and a square top face, 0.45 μm each side, as illustrated in FIG. 2. Also assuming now treat the distance between the adjacent ferroelectric capacitors 76 is 0.07 μm.

The dummy capacitor 78 has a planar shape typically as illustrated in FIG. 3. A capacitor pattern illustrated in FIG. 3 is obtained by folding a line pattern of 0.63 μm wide into a serpentine pattern while keeping a gap of 0.07 μm in between. It may alternatively be understood that slits 38 of 0.07 μm wide were provided to a square pattern so as to form a line pattern of 0.63 μm wide. The dummy capacitor 78 in this case has a base area of approximately 7.0 μm$^2$, which is larger than the base area (0.4 μm$^2$) of the ferroelectric capacitor 76. The line width of the dummy capacitor 78 is 0.63 μm, which equals to the width (0.63 μm) of the ferroelectric capacitor 76.

The reason why the width of gap in the line pattern of the dummy capacitor 78 is set to 0.07 μm, which equals to the distance between the adjacent ferroelectric capacitors 76, is to approximate etching profiles between the ferroelectric capacitor 76 and the dummy capacitor 78.

While it would not be fully appropriate to specify the shape of the dummy capacitor 78 with "line width", the dummy capacitor 78 of this embodiment may be understood as drawn with a serpentine line pattern, so that the term "line width" will be used hereinafter, assuming the dummy capacitor 78 as interconnects. Also in other embodiments, the term "line width" may be used on occasions in order to specify tee shape of the dummy capacitor 78, while locally assuming it as a line pattern. The "line width" of the dummy capacitor 78 in this specification may be defined, typically by the in the planar shape width among distances between the side faces which are opposed to specify a certain region of the dummy capacitor 78.

More specifically, the "line width" may be defined by the minimum width among distances between the side faces which are opposed to specify the base of the dummy capacitor 78. Similarly, the "width" of the ferroelectric capacitor may also be defined by the minimum width among distances between the side faces which are opposed to specify the base of the ferroelectric capacitor. In this case, in order to form a dummy capacitor having a line width larger than the width of the ferroelectric capacitor, the top face of the dummy capacitor is necessarily wider than the top face of the ferroelectric capacitor.

Next, the reason why the dummy capacitor 78 is formed into such pattern will be explained referring to FIG. 4 to FIG. 10.

FIG. 4 is a plan view illustrating a configuration of the semiconductor device of this embodiment, and FIG. 5 is an enlarged plan view of an area surrounded by a dotted line in FIG. 4.

On the silicon substrate 10, as illustrated in FIG. 4, a plurality of memory cell array regions 102 are provided. The peripheral circuit region 104 is arranged around the memory cell array regions 102. Now, the dummy capacitors 78 of the semiconductor device 100 according to the this embodiment are provided, as illustrated in FIG. 1 and FIG. 4, in the peripheral circuit region 104.

There have been known dummy capacitor structures directed to various purposes. A typical example relates to a dummy structure arranged in the outer circumference of the memory cell array, aimed at reducing an influence of dimensional variation of the ferroelectric capacitors 76. The dummy capacitor 78 of the semiconductor device 100 according to this embodiment is not this sort of dummy structure arranged in the memory cell array region 102, but a sort of dummy structure arranged in the peripheral circuit region 104. A role of the dummy structure arranged in the peripheral circuit region 104 is to increase the apparent occupancy of the ferroelectric capacitor structures in a chip, for the purpose of improving in-plane uniformity of dry etching for patterning a layered film to be fabricated into the ferroelectric capacitors.

The dummy capacitors 78 provided for this purpose typically form a regular-interval array of patterns each having the same shape and size with those of the ferroelectric capacitors 76 arranged in the memory cell array region 102. This is for the purpose of approximating the etching profiles between the ferroelectric capacitors 76 and the dummy capacitors 78. By arranging the patterns having the same size and pattern with those of the ferroelectric capacitors 76 at the same intervals, the etching profile of the ferroelectric capacitors 76 and the dummy capacitors 78 may be equalized. In this way, the dummy capacitors 78 may be formed according to process conditions for the ferroelectric capacitors 76 without modification.

In a semiconductor device having the ferroelectric capacitors 76 as illustrated in FIG. 2, a typical pattern of the dummy capacitors 78 is given as illustrated in FIG. 6.

However, while each ferroelectric capacitor 76 is brought into contact with the insulating interlayer 44 and the contact plugs 46 (see FIG. 7A), each dummy capacitor 78 is brought into contact only with the insulating interlayer 44 (FIG. 7B). By virtue of an anchoring effect of the contact plug 46, the ferroelectric capacitor 76 is less likely to cause a pattern defect due to separation of the lower electrode. On the contrary, the dummy capacitor 78 is likely to cause the pattern defect (see FIG. 8). When the pattern defect occurs, at worst, the separated capacitor structure would adhere to other functional region, to thereby cause operation failure of the semiconductor device or degrade the reliability.

Now, in the semiconductor device of this embodiment, each dummy capacitor 78 is widened in the base area as compared with the base area of the ferroelectric capacitor 76 so as to increase the contact area with the insulating interlayer 44, to thereby make the pattern defect less likely to occur.

Note, however, that only a simple increase in the base area of the dummy capacitor 78 may cause another problem in the process of patterning of the ferroelectric capacitor 76 and the dummy capacitor 78.

As illustrated in FIG. 9A, the ferroelectric capacitor 76 is formed by depositing a lower electrode layer 58, a ferroelectric film 60, an upper electrode layer 70, and hard masking films 72, 74, and then by patterning using a photoresist film 96. First, the hard masking films 72, 74 are patterned using the photoresist film 96 as a mask, and then by using the thus-patterned hard masking films 72, 74 as a mask, the upper electrode layer 70, the ferroelectric film 60 and the lower electrode layer 58 are patterned. The hard masking films 72, 74 on the upper electrode layer 70 are removed during the patterning of the upper electrode layer 70, the ferroelectric film 60 and the lower electrode layer 58 (see FIG. 9B).

However, if a trial is made to form the dummy capacitor 78 with a large area concurrently with the ferroelectric capacitor 76, the etchability would degrade, so that as illustrated in FIG. 10B the hard masking film 72 may remain at the center of the upper electrode layer 70 of the dummy capacitor 78. The hard masking film 72 thus remained on the upper electrode 70 may become a particle if drops in the succeeding processes, and may cause operation failure of the semiconductor device or may degrade the reliability. According to an investigation by the present inventor, such, residue of the hard masking film 72 was observed in a 2.5 μm×2.5 μm square dummy capacitor 78.

From this point of view, in the semiconductor device of this embodiment, the dummy capacitor 78 is specially considered to have an enlarged base area so as to increase the contact area with the insulating inter layer 44, and so as to have a line width not larger than the width of the ferroelectric capacitor 76.

In this way, it now becomes possible to suppress the pattern defect of the dummy capacitor 78, to obtain an etching profile similar to that of the ferroelectric capacitor 76, and to prevent the residue of the hard masking film from occurring. The semiconductor device may therefore be improved in the yield and reliability.

Note that, for the case where the dummy capacitors 78 have a plurality of line widths, it suffices that the maximum line width among them is set not larger than the width of the ferroelectric capacitor 76. For another case where the ferroelectric capacitors 76 have different widths is the vertical and transverse directions, the line width of the dummy capacitor 78 is set not larger than the minimum width of the ferroelectric capacitors 76.

Next a method of manufacturing a semiconductor device according to this embodiment will be explained referring to FIG. 11 to FIG. 16.

Figure 11:
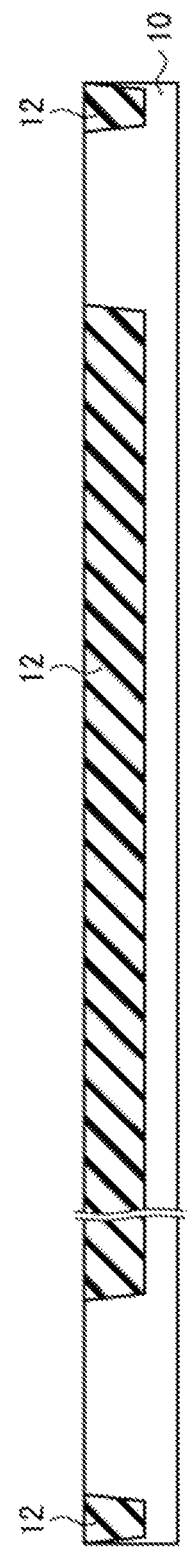
FIG. 11 to FIG. 16 are cross sectional process diagrams (part 1 to part 6) illustrating a method of manufacturing a semi-conductor device according to the first embodiment.

First, over the silicon substrate 10 of P-type for example, the element isolation insulating film 12 which demarcates the active regions is formed by a general method of forming the element isolation insulating film, such as STI (Shallow Trench Isolation) (FIG. 11).

Figure 12:
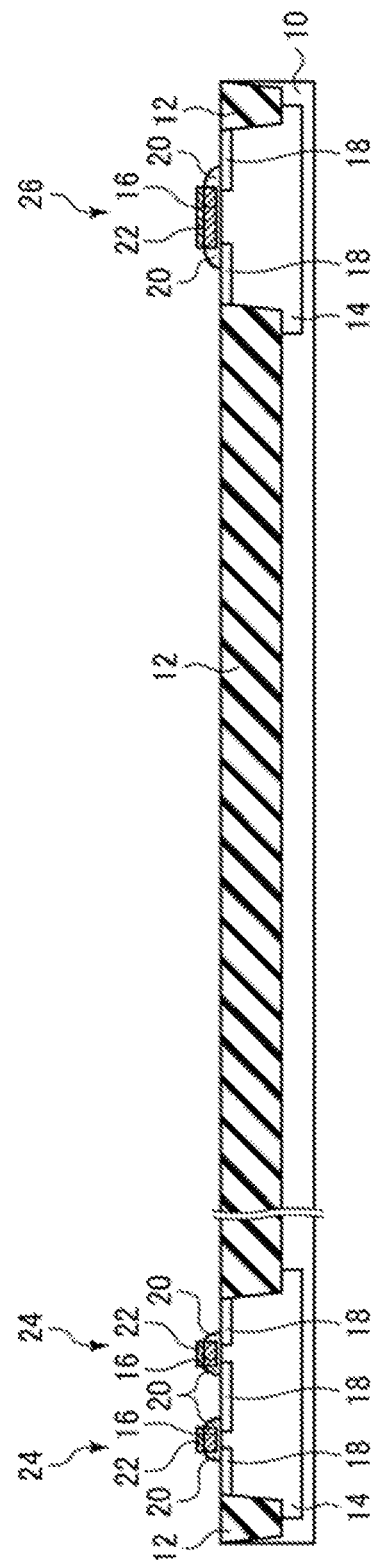

Next, in the active region of the silicon substrate 10, the MIS transistors 24, 26 having the P-well 14, the gate electrode 16, the source-drain region 18, the side wall insulating film 20, the silicide layer 22 and so forth, are formed by a general method of forming MIS transistor (FIG. 12). The MIS transistors 24 are selection transistors of the memory cells, and the MIS transistor 26 is a peripheral transistor configuring the peripheral circuit.

Next, over the silicon substrate 10 having the MIS transistors 24, 26 formed thereon, the silicon nitride film 28 as a stopper insulating film, the insulating interlayer 30, and the contact plugs 32 buried in the insulating interlayer 30 are formed by a general metallization process.

Next, over the insulating interlayer 30, the silicon nitride film 34 as a stopper insulating film, the insulating interlayer 36, and the interconnect layers 38, 40 buried in the insulating interlayer 36 are formed by a general metallization process. The interconnect layer 38 serves as a bit line, meanwhile the interconnect layer 40 typically serves as a relay interconnect.

Figure 13:
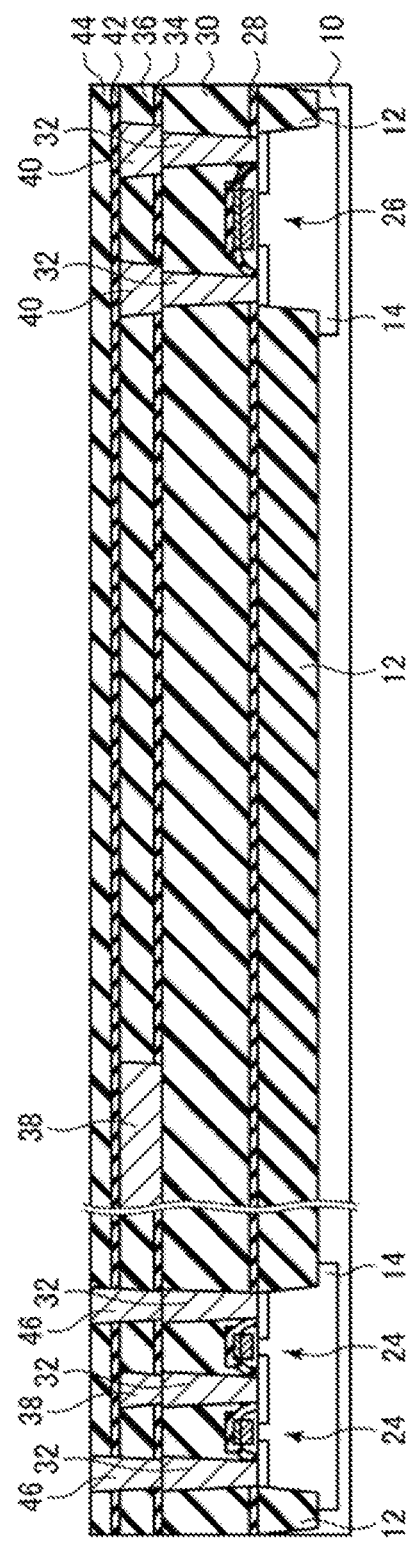

Next, over the insulating interlayer 36, the silicon nitride film 42 as the stopper insulating film, the insulating interlayer 44, and the contact plugs 46 buried in the insulating inter layers 44, 36 are formed by a general metallization process (FIG. 13).

The contact plugs 46 are formed by forming via holes in the insulating interlayers 44, 36, filling up the via holes with an electro-conductive film, and removing an excessive portion of the electro-conductive film over the insulating interlayer 44 by CMP (Chemical Mechanical Polishing). In some cases, the top portion of the contact plugs 46 may excessively be polished. In this case, the level of height of the top face of the contact plug 46 becomes lower than the level of height of the top face of the insulating interlayer 44, so that portions where the contact plugs 46 are filled will have recesses (not illustrated) formed therein.

Next, a Ti film, of 5 nm thick is formed typically by sputtering, and Ti film is then nitrified. In this way, over the insulating interlayer 44 having the contact plugs 46 buried therein, an underlying electro-conductive film 48 composed of a TiN film is formed.

Next, over the underlying electro-conductive film 48, a TiAlN film of, for example, 40 nm thick is formed typically by sputtering.

Next, the surface of the TiAlN film is polished by CMP, to thereby moderate the difference in height at the contact plugs 46. By the polishing, the thickness of the TiAlN film is reduced down to 20 nm or around. Note that the process of polishing is not always necessary, if there is no difference in height at the contact plugs 46.

Next, over the TiAlN film thus polished on the surface, another TiAlN film of, for example, 25 nm thick is formed typically by sputtering. In this way, over the underlying electro-conductive film 48, an electro-conductive oxygen barrier film 50 composed of TiAlN films of, for example, 45 nm thick in total is formed.

Next, over the electro-conductive oxygen barrier film 50, an Ir film 52 of 30 nm thick for example, an $IrO_x$ film 54 of 30 nm thick for example, and a Pt film 56 of 50 nm thick for example, are deposited typically by sputtering, to thereby form a lower electrode layer 58 having a structure of Pt film 56/$IrO_x$ film 54/Ir film 52. The $IrO_x$ film 54 is directed to improve adherence, and to cancel orientation. The Pt film 56 is directed to improve the orientation of the ferroelectric film 60. Note that, in this specification, the term "lower electrode layer 58" is occasionally used to also include the underlying electro-conductive film 48 and the electro-conductive oxygen barrier film 50.

Next, over the lower electrode 58, a ferroelectric film 60 typically configured by a PZT film is formed. The ferroelectric film 60 is typically formed by depositing a PZT film of 75 nm thick by sputtering over the lower electrode 58, and then annealing the film in an atmosphere containing Ar and $O_2$ within a snort time, to thereby orient the crystal of the PZT film conforming to the underlying Pt film 56.

Next, over the ferroelectric film 60, an $IrO_x$ film 62 of, for example, 25 nm is formed typically by sputtering. In the formation of the $IrO_x$ film 62, an iridium target is used, Ar and oxygen are used as reaction gases, and the sputtering is conducted at a pressure of 2 Pa, a substrate temperature of 300° C., and a sputtering power of 1 kW to 2 kW or around. Ratio of flow rates of Ar and oxygen is typically set to 100:56. By the formation under these conditions, the $IrO_x$ film 62 obtainable herein crystallizes as grown. Note that, before the $IrO_x$ film 62 is formed, an amorphous ferroelectric film of, for example, 10 nm thick or around may be formed.

Next, short-time annealing is conducted in an oxygen-containing atmosphere. Typical conditions for annealing include a ratio of flow rate of Ar and oxygen of 100:1, a substrate temperature of 725° C., and an annealing time of 60 seconds.

By the annealing, Ir in the $IrO_x$ film 62 diffuses downwards, and concurrently crystal orientation proceeds in the amorphous ferroelectric film from the lower side thereof, conforming to the crystal orientation of the underlying ferroelectric film 60. The film, once being an amorphous ferroelectrics, now functions as an electrode as a result of diffusion of Ir. Ir slightly diffuses also into the ferroelectric film 60, to thereby locate the boundary between the electrode and the ferroelectrics in the ferroelectric film 60.

Next, over the oxide electro-conductive film 62, an $IrO_x$ film 64 of, for example, 125 nm thick is formed typically by sputtering.

When the $IrO_x$ film 64 is formed, the film-forming temperature is preferably set to 100° C. or below, in order to suppress abnormal growth. In order to suppress degradation in the succeeding processes, the $IrO_x$ film may be configured by an $IrO_2$ film having a composition close to the stoichiometric composition. In this way, a catalytic action exerted on hydrogen may be suppressed, and the ferroelectric film 60 may be prevented from being reduced by a hydrogen radical. Thereby the hydrogen resistance may be improved.

Next, over the $IrO_x$ film 64, an Ir film 68 of, for example, 80 nm thick is formed typically by sputtering.

An upper electrode layer 70 having a layered structure of Ir film 68/$IrO_x$ film 64/$IrO_x$ film 62 is thus formed.

Next, over the upper electrode layer 70, a TiAlN film of, for example, 200 nm thick is deposited typically by sputtering, to thereby form a masking film 72 composed of the TiAlN film.

Figure 14:
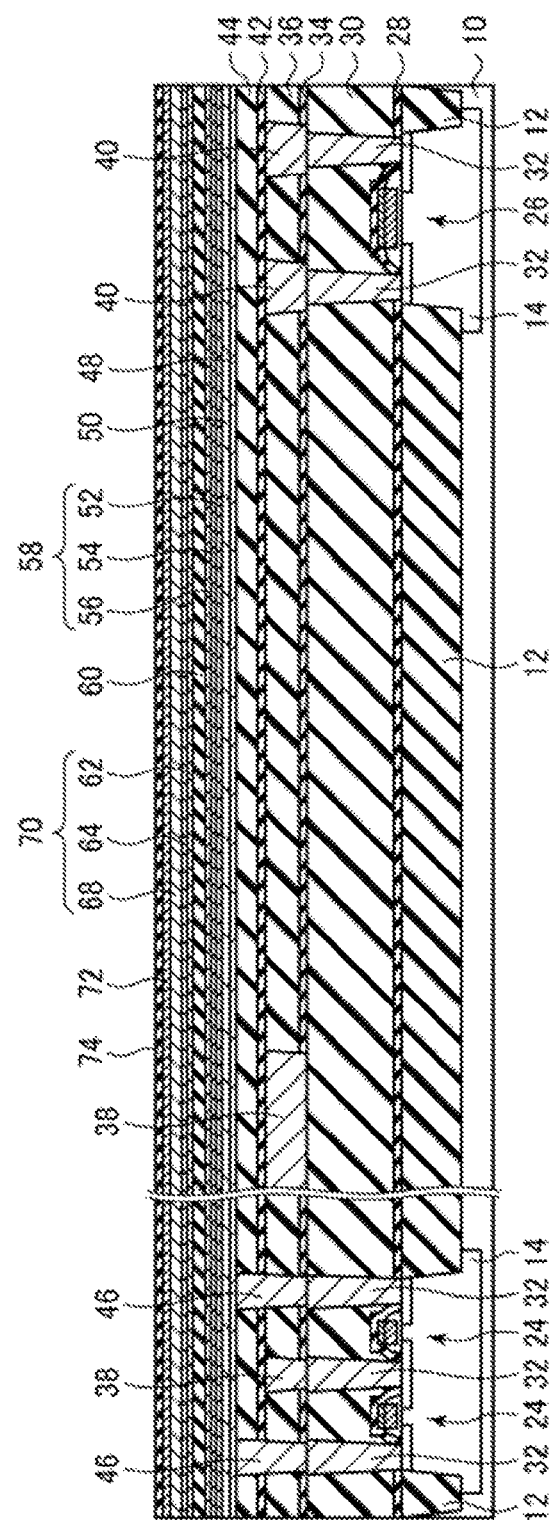

Next, over the masking film 72, a TEOS film 74 of, for example, 280 nm thick is formed typically by CVD (FIG. 14).

Next, the TEOS film 74 and the masking film 72 are patterned by photolithography and dry etching.

In this process, a pattern for forming the dummy capacitors 78 is designed to yield a larger base area than a pattern for forming the ferroelectric capacitors 76. In addition, the line width of the pattern for forming the dummy capacitors 78 is designed to be not larger than the width of the pattern for forming the ferroelectric capacitors 76. The width of the silt 98 is designed equal to the distance between the adjacent ferroelectric capacitors 76.

For example, the pattern for forming the ferroelectric capacitors 76 is typically given a form of square of 0.63 µm each side, and a distance between the adjacent ferroelectric capacitors 76 of 0.07 µm. On the other hand, the pattern, for forming the dummy capacitors 78 is typically given a form typically as illustrated in FIG. 3, as if a line pattern of 0.63 µm wide was folded into a serpentine pattern while keeping a gap of 0.07 µm in between. The capacitor pattern illustrated in FIG. 3 is now understood as being formed by connecting the adjacent capacitor patterns illustrated in FIG. 6, so as to give a serpentine-like pattern as a whole.

Note that, in a typical case, the size and distance of the ferroelectric capacitors 76 are designed according to a design rule applicable to the process. In this case, the maximum line width of the dummy capacitors 78 is designed equal to the size of the ferroelectric capacitors 76, and the width of the slit 98 is designed equal to the distance between the adjacent, ferroelectric capacitor 76. By equalizing the size of the ferroelectric capacitor 76 and the dummy capacitor 78, the man-hour may successfully be reduced.

Next, a photoresist film used for patterning the TEOS film 74 and the masking film 72 is removed, and then using the TEOS film 74 and the masking film 72 as a mask, the upper electrode 70, the ferroelectric film 60, the lower electrode 58, the electro-conductive oxygen barrier film 50 and the underlying electro-conductive film 48 are patterned.

By patterning the ferroelectric capacitors 76 and the dummy capacitors 78 using the above-described pattern, an etching profile obtainable in the portion of the dummy capacitors 78 will be sumo as that obtainable in the portion of the ferroelectric capacitors 76, while preventing a residue of the masking film 72 from generating. By increasing the area of the dummy capacitors 78, it also becomes possible to avoid the pattern defect in the succeeding processes.

In this way, in the memory cell array region 102, the ferroelectric capacitors 76 having a layered structure of upper electrode layer 70/ferroelectric film 60/lower electrode layer 58 are formed, and similarly in the peripheral circuit region 104, the dummy capacitors 78 having the same layered structure are formed.

The lower electrode layer 58 of the ferroelectric capacitors 76 is electrically connected mainly through the contact plugs 46, 32 to the selection transistors (MIS transistors 24). A plurality of memory cells of the 1T-1C type are thus formed in the memory cell array region.

Next, the product is annealed in an oxygen-containing atmosphere, typically at 350° C. for 40 minutes.

Next, over the insulating interlayer 44 having the ferroelectric capacitors 76 and the dummy capacitors 78 formed thereon, an alumina film of, for example, 5 nm to 20 nm thick is formed typically by sputtering.

Next, the product is annealed, in an oxygen-containing atmosphere typically at 500° C. to 650° C., to thereby restore damages introduced when the alumina film was formed.

Next, over the alumina film, another alumina film of, for example, 80 nm to 100 nm thick is formed typically by MOCVD or ALD.

In this way, the protective insulating film 80 composed of the alumina films of, for example, 35 nm to 120 nm thick in total is formed.

Next, over the protective insulating film 80, the insulating interlayer 82 of, for example, 1400 nm thick is formed. When the insulating interlayer 82 is configured by a silicon oxide film, the silicon oxide film is typically formed by plasma-assisted CVD, by using a mixed gas of TEOS and helium as source gases. The insulating interlayer 82 may alternatively be formed, for example, by an insulating inorganic film other than the silicon oxide film.

Figure 15:
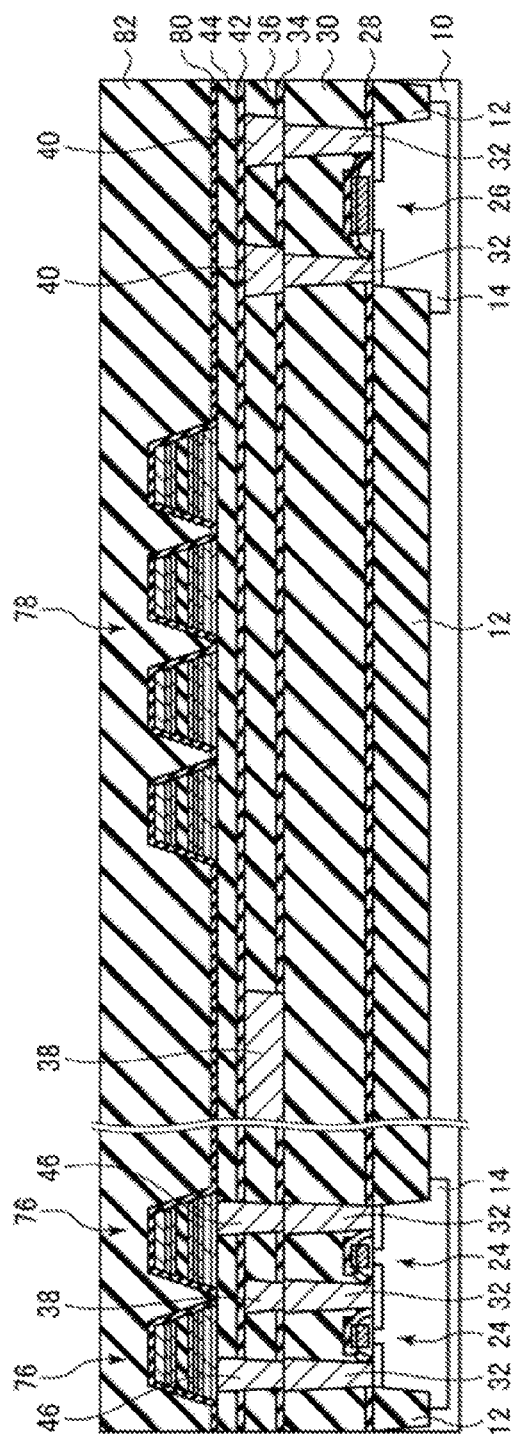

Next, the surface of the insulating interlayer 82 is polished for planarization by CMP (FIG. 15).

Next, the silicon substrate 10 is annealed by exposing it into a plasma atmosphere produced typically using $N_2O$ gas or $N_2$ gas. As a result of the annealing, moisture mainly in the insulating interlayer 82 is removed, and mainly the insulating interlayer 82 is modified so as to allow water less likely to come therein.

Alternatively, after the insulating interlayer 82 was planarized by CMP, a P-TEOS film of, for example, 250 nm thick or around may be deposited so as to fill up the slits between the adjacent capacitors which would emerge in CMP. Also in this case, the deposited film is preferably exposed to a plasma atmosphere produced mainly using $N_2O$ gas or $N_2$ gas, in order to reduce the moisture content in the film.

Next, in the insulating interlayers 82, 44, the upper electrode layer 70 of the ferroelectric capacitors 76, and the contact plugs 84 connected to the interconnect layers 38, 40 and so forth are formed by a general metallization process.

Next, over the insulating interlayer 82, the interconnect layer 86 connected to the contact plugs 84 is formed, by a general metallization process.

Next, over the insulating interlayer 82 having the interconnect layer 86 formed thereon, the insulating interlayer 88, and the contact plugs 90 which are buried in the insulating interlayer 88 and connected to the interconnect layer 86 are formed, by a general metallization process.

Next, over the insulating interlayer 88 having the contact plug 90 buried therein, the interconnect layer 92 connected to the contact plugs 90 is formed by a general metallization process.

Figure 16:
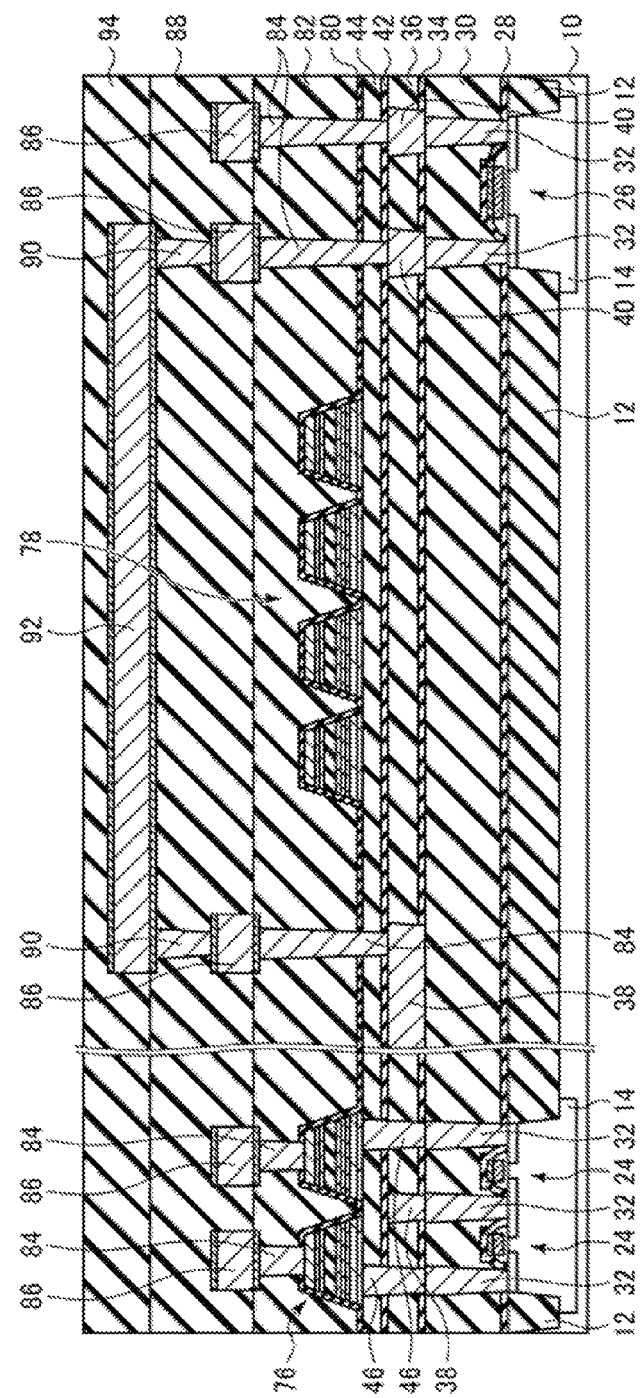

Next, over the insulating interlayer 88 having the interconnect layer 92 formed thereon, the insulating interlayer 94 is formed (FIG. 16).

The process is then followed by necessary back process to complete the semiconductor device of this embodiment.

As described above, according to this embodiment, it now becomes possible to suppress the pattern defect of the dummy capacitors, and the residue of the hard masking film from generating. The yield and reliability of the semiconductor device may thus be improved.

Second Embodiment

A semiconductor device and a method of manufacturing the same according to a second embodiment will be explained referring to FIG. 17 and FIG. 18. All constituents same as those of the semiconductor device and the method of manufacturing the same according to the first embodiment, illustrated in FIG. 1 to FIG. 16, will be given same reference numerals, in order to avoid a repetitive explanation or to skip the detail.

Figure 17:
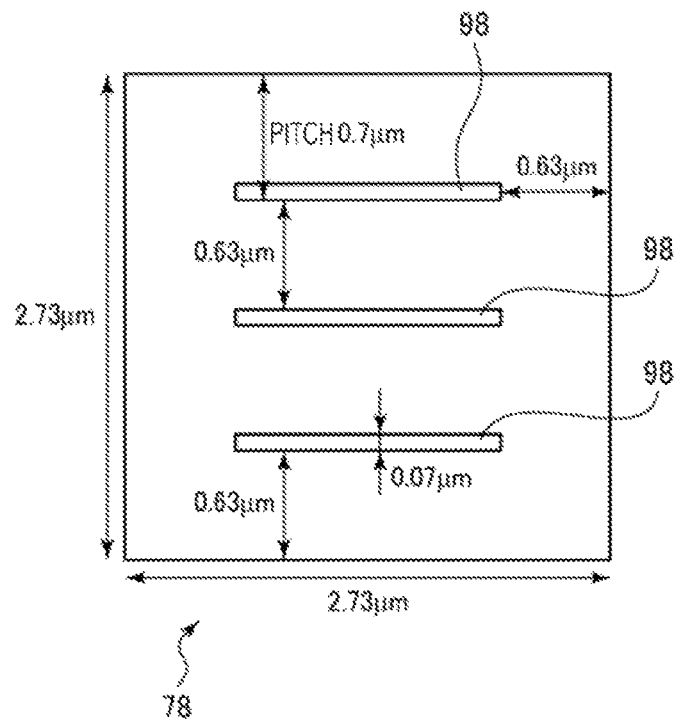
FIG. 17 is a plan view illustrating a configuration of a semiconductor device according to a second embodiment.
Figure 18:
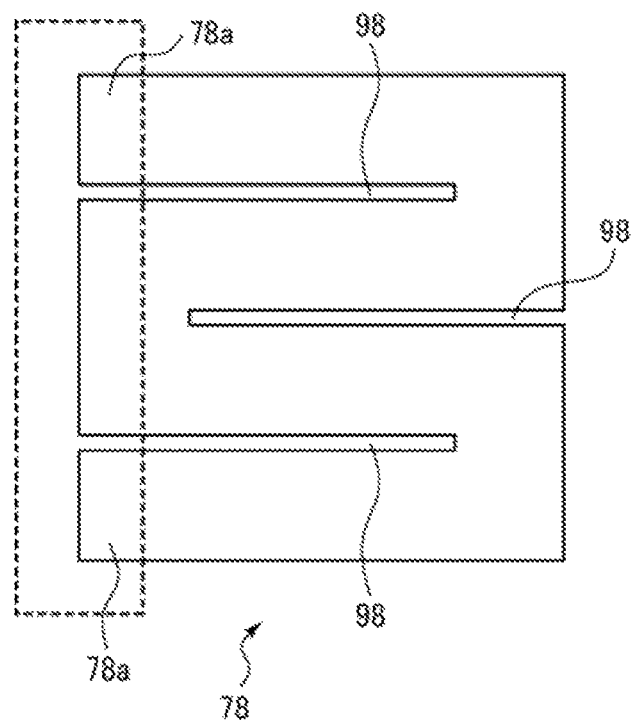
FIG. 18 is a drawing explaining a problem in the dummy capacitor of the semiconductor device according to the first embodiment.

FIG. 17 is a plan view illustrating a configuration of a semiconductor device of this embodiment. FIG. 18 is a drawing explaining a problem in the dummy capacitor of the semiconductor device according to the first embodiment.

First, the configuration of the semiconductor device of this embodiment will be explained referring to FIG. 17 and FIG. 18.

The semiconductor device of this embodiment is configured similarly to the semiconductor device of the first embodiment, except for the pattern of the dummy capacitor 78.

The dummy capacitor 78 of the semiconductor device of this embodiment has, as illustrated in FIG. 17, a square outline larger than the base area of the ferroelectric capacitor 76, and as recessed from the outline, the silts 98 are provided so as to make the line width of the pattern not larger than the width of the ferroelectric capacitor 76. In the pattern of the dummy capacitor 78 in this embodiment illustrated in FIG. 17, the "line width" represents the minimum distance between, the outer circumferential edge and the silt 98, and, the minimum distance between the adjacent slits 98.

By such configuration, similarly to the first embodiment, the pattern defect, due to separation of the lower electrode film of the dummy capacitors 78 may be suppressed, the etching profile similar to that of the ferroelectric capacitors 76 may be obtained, and the residue of the hard mashing film may be prevented from generating. The yield and reliability of the semiconductor device may thus be improved.

In the dummy capacitors 78 in the semiconductor device of this embodiment, the reason why the slits 98 are provided within the outline of the pattern is as follows.

When the semiconductor device is manufactured, a plurality of chip regions are provided on a single semiconductor wafer. Among the chip regions, some of them located in the peripheral portion of the semiconductor wafer may lack a part of the pattern.

Consider now the case where the dummy capacitor 78 in the first embodiment illustrated in FIG. 6 is used. When the chip region containing the dummy capacitor 78 is located at the edge portion of the semiconductor wafer, only a part of the dummy capacitor 78 may be formed on the semiconductor wafer. For an exemplary case where only a portion of the pattern of the dummy capacitor 78, surrounded by the dotted line illustrated in FIG. 18, were formed on the semiconductor wafer, micro-dummy capacitors 78a having the base area, smaller than that of the ferroelectric capacitor 76 would occur. Such micro-dummy capacitors 78a are causative of the pattern defect.

One possible cause of generation of the micro-dummy capacitors 78a is that the slits 98, which are provided to make the maximum line width of the dummy capacitor 78 not larger than the minimum width of the ferroelectric capacitor 76, reach the outer circumference of the dummy capacitor 78.

Now by arranging the slits 98 as recessed the outline of the pattern, the pattern may be prevented from being divided into a plurality of segments, even if only a part of the dummy capacitor 78 were formed, thereby the micro-dummy capacitors 78a become less likely to occur. The pattern defect of the dummy capacitor 78 may thus be suppressed, and the yield and reliability of the semiconductor device may further be improved.

A method of manufacturing a semiconductor device of this embodiment is same as the method of manufacturing a semiconductor device of the first embodiment, except for the pattern of the dummy capacitors 78.

As described above, according to this embodiment, it now becomes possible to suppress the pattern defect of the dummy capacitors, and the residue of the hard masking film from generating. The yield and reliability of the semiconductor device may thus be improved.

Third Embodiment

A semiconductor device and a method of manufacturing the same according to a third embodiment will be explained referring to FIG. 19 and FIG. 20. All constituents same as those of the semiconductor devices and the methods of manufacturing the same according to the first and second embodiments, illustrated in FIG. 1 to FIG. 18, will be given same reference numerals, in order to avoid a repetitive explanation, or to skip the detail.

Figure 19:
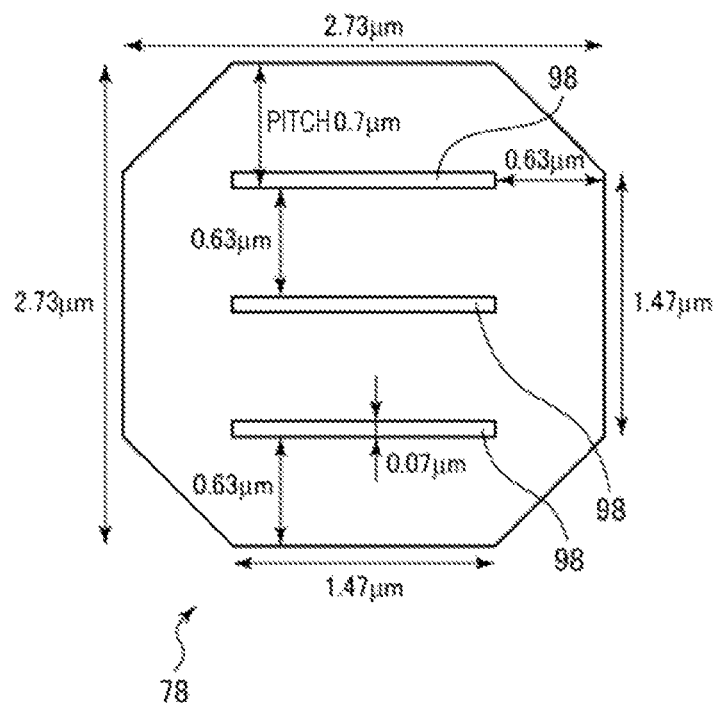
FIG. 19 is a plan view illustrating a configuration of a semiconductor device according to a third embodiment.

FIG. 19 is a plan view illustrating a configuration of the semiconductor device of this embodiment. FIG. 20 is a drawing explaining a problem in the dummy capacitor of the semiconductor device of the second embodiment.

First, the configuration of the semiconductor device of this embodiment will be explained referring to FIG. 19 and FIG. 20.

The semiconductor device of this embodiment is configured similarly to the semiconductor devices of the first and second embodiments, except for the pattern of the dummy capacitor 78.

The dummy capacitor 78 of the semiconductor device of this embodiment is rounded, as illustrated in FIG. 19, at the corners of the square outline of the dummy capacitor 78 of the semiconductor device of the second embodiment illustrated in FIG. 17.

Figure 20:
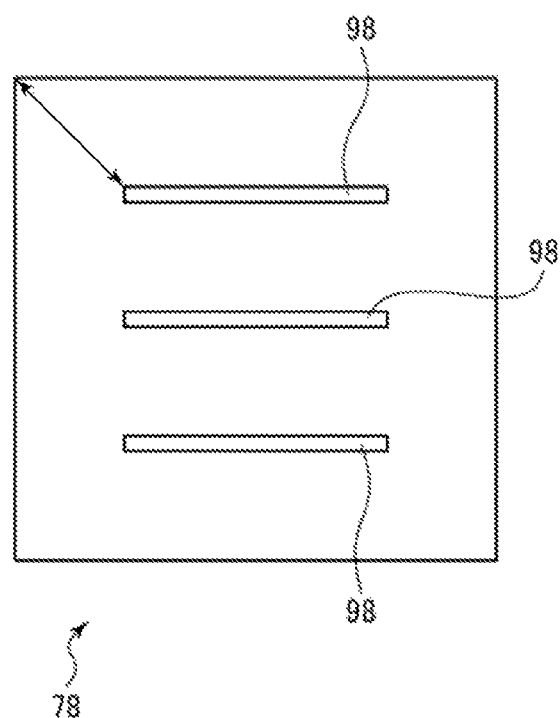
FIG. 20 is a drawing explaining a problem in the dummy capacitor of the semiconductor device according to the second embodiment.

In the dummy capacitor 78 of the semiconductor device of the second embodiment, since the slits 98 are formed so as to be recessed from the outline of the pattern, so that in some place, the distance between the slit 98 to the pattern edge will become longer typically as indicated by an arrow in FIG. 20. In such place, the etchability in the slits 98 tends to degrade, giving rise to fears that the residue of the hard mask will remain in the process of etching.

Now by chamfering the square outline at the corners, the distance between the slit 98 and the pattern edge becomes shorter than in the second embodiment. In this way, the etchability may be improved, and the residue of the hard mask may further be suppressed from remaining.

The method of manufacturing a semiconductor device of this embodiment is same as the method of manufacturing a semiconductor device of the first embodiment, except for the pattern of the dummy capacitors 78.

As described above, according to this embodiment, it now becomes possible to suppress the pattern defect due to separation of the lower electrode film, of the dummy capacitors, and generation of the residue of the hard masking film. The yield and reliability of the semiconductor device may thus be improved.

Fourth Embodiment

A semiconductor device and a method of manufacturing the same according to a fourth embodiment will be explained referring to FIG. 21. All constituents same as those of the semiconductor devices and the methods of manufacturing the same according to the first to third embodiments, illustrated in FIG. 1 to FIG. 20, will be given same reference numerals, in order to avoid a repetitive explanation or to skip the detail.

Figure 21:
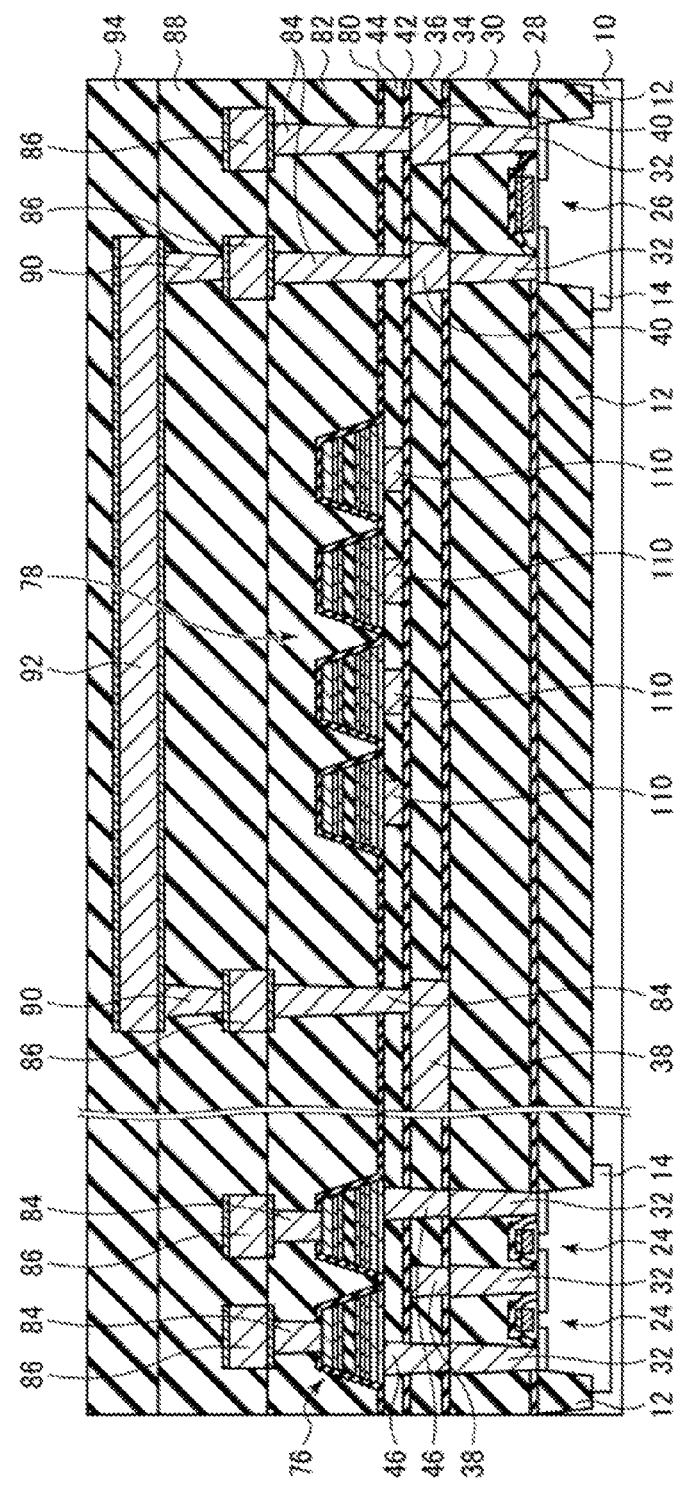
FIG. 21 is a schematic cross sectional view illustrating a configuration of a semiconductor device according to a fourth embodiment.

FIG. 21 is a schematic cross sectional view illustrating a configuration of the semiconductor device of this embodiment.

First, the configuration of the semiconductor device of this embodiment will be explained referring to FIG. 21.

As illustrated in FIG. 21, the semiconductor device of this embodiment additionally has dummy plugs 110 buried in the insulating interlayer 44, wherein the dummy capacitors 78 are connected to the dummy plugs 110. The dummy capacitor 78 may be configured using the pattern typically illustrated in FIG. 6, without special limitation. When the pattern illustrated in FIG. 6 is used, at least one dummy plug 110 is provided to each pattern of the dummy capacitor 78. By connecting the dummy capacitors 78 to the dummy plugs 110, similarly to the case of ferroelectric capacitors 76, the dummy plugs 110 act as an anchor, and can suppress the pattern defects due to separation of the lower electrode.

The dummy capacitor 78 may have a pattern same as those of the dummy capacitors 78 of the semiconductor devices according to the first to third embodiments illustrated, in FIGS. 3, 17 and 19. With such configuration, in conjunction with increase in the area of the dummy capacitors 78, the pattern defect may further be suppressed.

The semiconductor device of this embodiment, may be manufactured by forming the dummy plugs 110 buried in the insulating interlayer 44, by a general metallization process, in the step illustrated in FIG. 13 in the method of manufacturing a semiconductor device of the first embodiment.

The dummy plugs 110, which are buried in the insulating interlayer 44 in FIG. 21, may alternatively be buried in the insulating inter layers 44, 36, similarly to the contact plugs 46. In this case, the dummy plugs 110 and the contact plugs 46 may also be formed at the same time.

As described above, according to this embodiment, it now becomes possible to suppress the pattern defect of the dummy capacitors, and thereby the yield and reliability of the semiconductor device may be improved.

Modified Embodiments

The present invention may be modified in various ways, without being limited to the embodiments described above.

For example, while the first to third embodiments described above exemplified the patterns illustrated in FIGS. 3, 17 and 19, as the dummy patterns 78 having the base area larger than that, of the ferroelectric capacitors 76 and having the line width not larger than the width of the ferroelectric capacitors 76, the pattern of the dummy capacitors 78 is not limited thereto. For the dummy capacitors 78, any arbitrary pattern may be used, provided that it has the base area larger than that of the ferroelectric capacitors 76, and has the line width not larger than the width of the ferroelectric capacitors 76.

Figure 22:
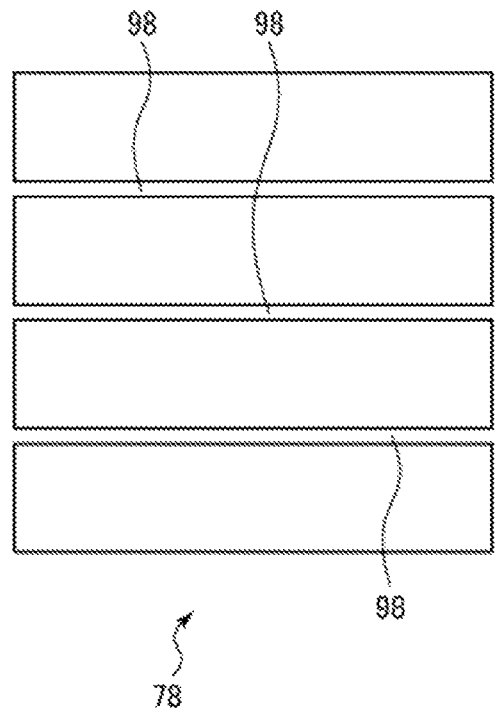
FIG. 22 to FIG. 24 are plan views (part 1 to part 3) illustrating configurations of semiconductor devices according to modified examples of the embodiments.
Figure 23:
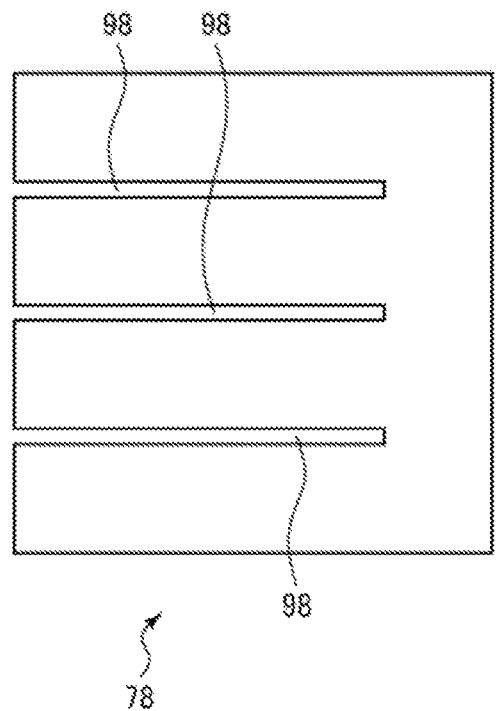
Figure 24:
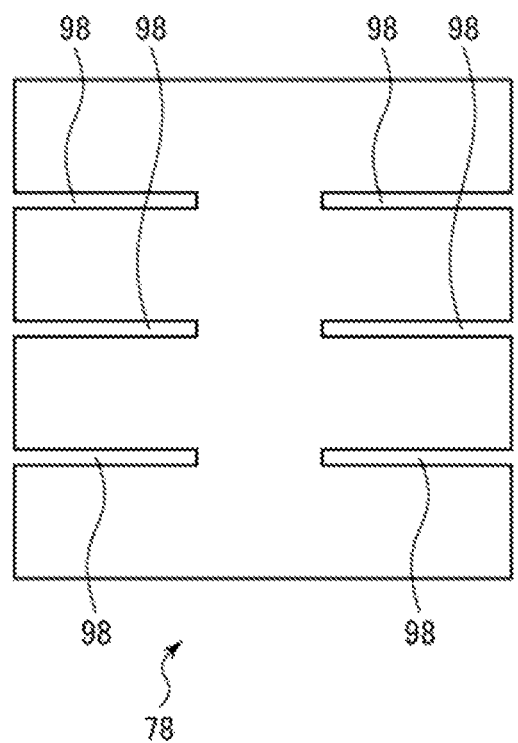

For example, as illustrated in FIG. 22, the line pattern may be arranged into stripes. Alternatively, comb-like patterns typically illustrated in FIG. 23 and FIG. 24 are acceptable.

The dimensions of the individual parts of the ferroelectric capacitors 76 and the dummy capacitors 78 described above are only illustrative, and may arbitrarily be modified depending on the design rule of the semiconductor device, or other requirements.

All of configurations, constitutive materials, conditions for manufacturing and so forth of the semiconductor devices described in the embodiments above are merely illustrative, and may be modified or altered in appropriate ways in view of common general technical, knowledge of those skilled in the art.

According to the semiconductor device and the method of manufacturing the same disclosed above, it now becomes possible to effectively suppress the pattern defect of the dummy capacitors, and thereby the yield and reliability of the semiconductor device may be improved.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:
a semiconductor substrate that includes a memory cell array region and a peripheral circuit region;
a ferroelectric capacitor formed over the semiconductor substrate in the memory cell array region, with a first area and a first width; and
a dummy capacitor formed over the semiconductor substrate in the peripheral circuit region, with a layered structure same as a layer structure of the ferroelectric capacitor, with a second area larger than the first area, and with a second width not larger than the first width,
wherein the dummy capacitor includes a slit that determines the second width.

2. The semiconductor device according to claim 1,
further comprising a plurality of ferroelectric capacitors formed in the memory cell array region, and
wherein the width of the slit is equal to the distance between the dummy capacitor and the adjacent ferroelectric capacitors arranged in the memory cell array region.

3. The semiconductor device according to claim 1,
wherein the slit is formed in an interior region of the dummy capacitor.

4. The semiconductor device according to claim 1,
wherein the dummy capacitor is rounded at the corners in the planar shape.

5. The semiconductor device according to claim 1,
wherein the dummy capacitor includes a line pattern arranged serpentine-like.

6. The semiconductor device according to claim 1,
wherein the second width is equal to the first width.

7. The semiconductor device according to claim 1,
wherein the first area is the base area of the ferroelectric capacitor,
the first width is the minimum width among the base widths of the ferroelectric capacitor,
the second area is the base area of the dummy capacitor, and
the second width is the minimum width among the base widths of the dummy capacitor.

8. The semiconductor device according to claim 1, further comprising:
an insulating film formed over the semiconductor substrate, and
a dummy plug, that is connected to the dummy capacitor, formed in the insulating film.

9. A semiconductor device comprising:
a semiconductor substrate that includes a memory cell array region and a peripheral circuit region;
an insulating film formed over the semiconductor substrate;
a ferroelectric capacitor formed over the insulating film in the memory cell array region;
a dummy plug formed in the insulating film in the peripheral circuit region; and
a dummy capacitor, that is connected to the dummy plug, formed over the insulating film in the peripheral circuit region,
wherein the dummy capacitor includes a slit that determines a width of the dummy capacitor.

* * * * *